(12) United States Patent
Lin et al.

(10) Patent No.: US 9,318,354 B2
(45) Date of Patent: Apr. 19, 2016

(54) SEMICONDUCTOR PACKAGE AND FABRICATION METHOD THEREOF

(71) Applicant: Siliconware Precision Industries Co., Ltd., Taichung (TW)

(72) Inventors: Pang-Chun Lin, Taichung (TW); Xie-Ren Cheng, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 292 days.

(21) Appl. No.: 13/922,858

(22) Filed: Jun. 20, 2013

(65) Prior Publication Data

US 2014/0284803 A1 Sep. 25, 2014

(30) Foreign Application Priority Data

Mar. 21, 2013 (TW) .............................. 102109980 A

(51) Int. Cl.
| | |
|---|---|
| *H01L 23/498* | (2006.01) |
| *H01L 21/56* | (2006.01) |
| *H01L 23/31* | (2006.01) |
| *H01L 23/00* | (2006.01) |

(52) U.S. Cl.
CPC ............ *H01L 21/56* (2013.01); *H01L 23/3128* (2013.01); *H01L 23/49827* (2013.01); *H01L 23/49838* (2013.01); *H01L 23/49894* (2013.01); *H01L 21/565* (2013.01); *H01L 23/49816* (2013.01); *H01L 24/34* (2013.01); *H01L 24/36* (2013.01); *H01L 24/39* (2013.01); *H01L 2224/32225* (2013.01); *H01L 2224/48091* (2013.01); *H01L 2224/48227* (2013.01); *H01L 2224/73265* (2013.01); *H01L 2924/15311* (2013.01); *H01L 2924/19107* (2013.01)

(58) Field of Classification Search
CPC ....................................................... H01L 24/73
See application file for complete search history.

(56) References Cited

U.S. PATENT DOCUMENTS 5,043,526 A * 8/1991 Nakagawa et al. ........... 174/250

* cited by examiner

*Primary Examiner* — William Harriston
(74) *Attorney, Agent, or Firm* — Mintz Levin Cohn Ferris Glovsky and Popeo, P.C.; Peter F. Corless; Steven M. Jensen

(57) ABSTRACT

A semiconductor package is disclosed, which includes: a substrate having a plurality of switching pads, a plurality of first conductive pads and a plurality of circuits formed between the switching pads and the first conductive pads; an insulating layer covering the circuits; a conductive layer formed on the insulating layer and extending to the switching pads and the first conductive pads; and a semiconductor element disposed on the substrate and electrically connected to the switching pads through a plurality of bonding wires. By electrically connecting the switching pads and the first conductive pads through the conductive layer, the invention dispenses with the conventional short bonding wires so as to prevent the conventional problem of short circuits caused by contact of the short bonding wires with other bonding wires.

16 Claims, 3 Drawing Sheets

SEMICONDUCTOR PACKAGE AND FABRICATION METHOD THEREOF

CROSS-REFERENCE TO RELATED APPLICATIONS

This application claims under 35 U.S.C. §119(a) the benefit of Taiwanese Application No. 102109980, filed Mar. 21, 2013, the entire contents of which is incorporated herein by reference.

BACKGROUND OF THE INVENTION

1. Field of the Invention

The present invention relates to semiconductor packages and fabrication methods thereof, and more particularly, to a semiconductor package and a fabrication method thereof for meeting the miniaturization requirement of electronic products.

2. Description of Related Art

Along with the rapid development of electronic industries and the progress of semiconductor processing technologies, semiconductor chips are integrated with more electronic elements to achieve better electrical performance. Accordingly, the semiconductor chips are provided with more I/O connections. To meet the miniaturization requirement of semiconductor packages, substrates used for carrying the semiconductor chips are required to have a high density of wire bonding pads corresponding to the I/O connections of the semiconductor chips. FIG. 1A shows a conventional semiconductor package 1.

Referring to FIG. 1A, a semiconductor chip 13 is disposed on a substrate 10, and electrode pads 130 of the semiconductor chip 13 are electrically connected to wire bonding pads 102 of the substrate 10 through a plurality of bonding wires 14. Then, an encapsulant 15 is formed on the substrate 10 for encapsulating the semiconductor chip 13 and the bonding wires 14.

However, in order to meet the miniaturization requirement, the space on the substrate 10 around the semiconductor chip must be reduced, thus resulting in a high density of the wire bonding pads 102. Therefore, it becomes difficult to perform a wire bonding process. Further, a short circuit easily occurs between adjacent bonding wires 14.

To overcome the above-described drawbacks, a plurality of switching pads are provided for electrically connecting electrode pads of a semiconductor chip and wire bonding pads of a substrate, as shown in FIGS. 1B and 1B'.

Referring to FIG. 1B, a substrate 10 having an insulating layer 10b and a circuit layer 10a embedded in the insulating layer 10b is provided. The circuit layer 10a has a plurality of switching pads 100, a plurality of first and second wire bonding pads 101, 102' and a plurality of circuits 103 formed between the switching pads 100 and the first wire bonding pads 101. A semiconductor chip 13 having a plurality of electrode pads 130 is disposed on the substrate 10. A portion of the electrode pads 130 of the semiconductor chip 13 are electrically connected to the switching pads 100 through a plurality of first short bonding wires 14a, and the switching pads 100 are further electrically connected to the first wire bonding pads 101 through a plurality of second short bonding wires 14b. The other portion of the electrode pads 130 of the semiconductor chip 13 are electrically connected to the second wire bonding pads 102' through a plurality of bonding wires 14. Then, an encapsulant 15 is formed on the substrate 10 for encapsulating the semiconductor chip 13, the first and second short bonding wires 14a, 14b, the bonding wires 14, the switching pads 100, and the first and second wire bonding pads 101, 102'. Thereafter, a plurality of conductive elements 16 such as solder balls are formed on portions of the circuit layer 10a exposed from the insulating layer 10b.

However, since the second short bonding wires 14b have a certain wire loop, the second short bonding wires 14b easily come into contact with the bonding wires 14 and cause a short circuit.

To overcome the above-described drawback, the wire loop of the bonding wires 14 can be increased, which however increases the overall height of the semiconductor package 1' and hinders the miniaturization of the semiconductor package 1'.

Further, since the substrate 10 only has the single circuit layer 10a, the wiring space of the substrate 10 is quite limited and not flexible. As such, the circuits 103 can only be formed in a plane instead of in multiple layers.

Therefore, how to overcome the above-described drawbacks has become urgent.

SUMMARY OF THE INVENTION

In view of the above-described drawbacks, the present invention provides a semiconductor package, which comprises: a substrate having a plurality of switching pads, a plurality of first conductive pads and a plurality of circuits formed between the switching pads and the first conductive pads; a first insulating layer covering the circuits; a conductive layer formed on the first insulating layer and extending to the switching pads and the first conductive pads; and a semiconductor element disposed on the substrate and electrically connected to the switching pads through a plurality of bonding wires.

In the above-described semiconductor package, the substrate can further have a second insulating layer that is formed in a manner that the switching pads and the first conductive pads are embedded in the second insulating layer and surfaces of the switching pads and the first conductive pads are exposed from the second insulating layer.

The present invention further provides a fabrication method of a semiconductor package, which comprises the steps of: providing a substrate having a plurality of switching pads, a plurality of first conductive pads and a plurality of circuits formed between the switching pads and the first conductive pads; forming a first insulating layer to cover the circuits; forming a conductive layer on the first insulating layer, wherein the conductive layer extends to the switching pads and the first conductive pads; and disposing a semiconductor element on the substrate and electrically connecting the semiconductor element and the switching pads through a plurality of bonding wires.

In the above-described semiconductor package and fabrication method thereof, the substrate can further have a plurality of second conductive pads. The semiconductor element is electrically connected to the second conductive pads through a plurality of bonding wires.

In the above-described semiconductor package and fabrication method thereof, the circuits can protrude above a surface of the substrate.

In the above-described semiconductor package and fabrication method thereof, the switching pads, the conductive layer and the first conductive pads can form conductive paths.

In the above-described semiconductor package and fabrication method thereof, a surface processing layer can be formed on the switching pads, the circuits and the first conductive pads.

In the above-described semiconductor package and fabrication method thereof, the first insulating layer can be made of an adhesive and formed by inkjet printing, coating or dispensing.

In the above-described semiconductor package and fabrication method thereof, the conductive layer can be a metal layer formed by inkjet printing or screen printing or an adhesive layer formed by coating, dispensing or inkjet printing so as to form conductive traces.

In the above-described semiconductor package and fabrication method thereof, an encapsulant can be formed on the substrate for encapsulating the semiconductor element, the bonding wires, the switching pads, the conductive layer and the first conductive pads.

Therefore, the present invention electrically connects the switching pads and the first conductive pads through the conductive layer instead of the conventional short bonding wires. Since the conductive layer has a height much lower than the wire loop of the conventional short bonding wires, during a wire bonding process, long bonding wires will not come into contact with the conductive layer, thus preventing a short circuit form occurring. Further, the present invention can reduce the wire loop of the long bonding wires and hence reduce the thickness of the encapsulant so as to thin the semiconductor package.

Furthermore, the formation of the first insulating layer and the conductive layer on the circuits of the substrate facilitates to increase the wiring space and the wiring flexibility.

BRIEF DESCRIPTION OF DRAWINGS

FIG. 1B' is a partially upper view of FIG. 1B;

FIG. 2A' is a schematic cross-sectional view showing another embodiment of FIG. 2A; and FIG. 2C' is a partially upper view of FIG. 2C.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "upper", "a" etc. are merely for illustrative purposes and should not be construed to limit the scope of the present invention.

Figure 1A:
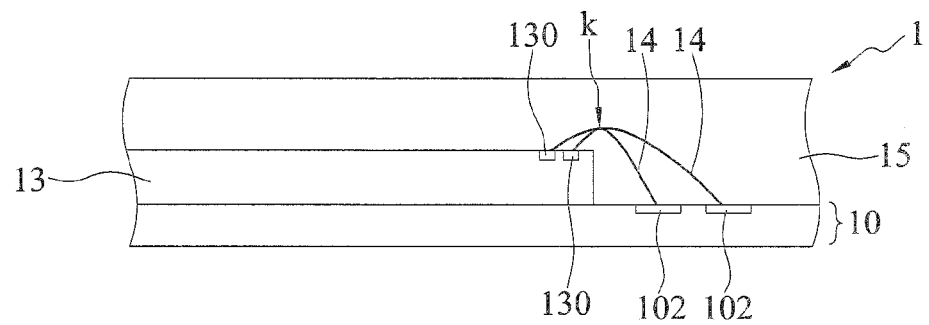
FIG. 1A is a schematic cross-sectional view of a conventional semiconductor package.
Figure 1B:
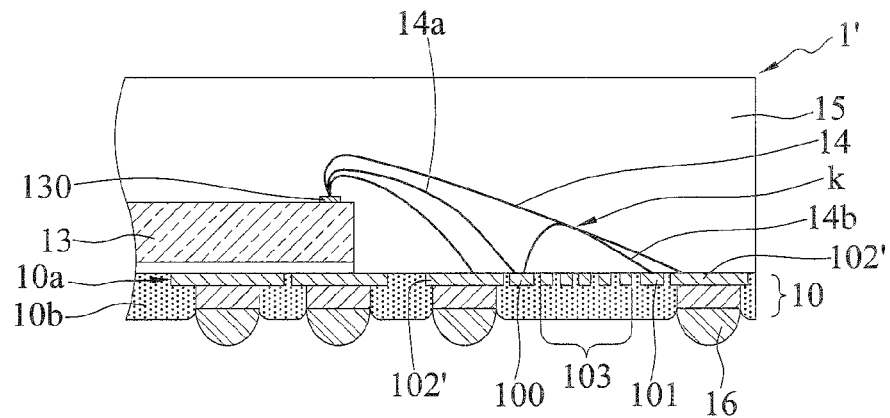
FIG. 1B is a schematic cross-sectional view of a conventional semiconductor package.
Figure 1B:
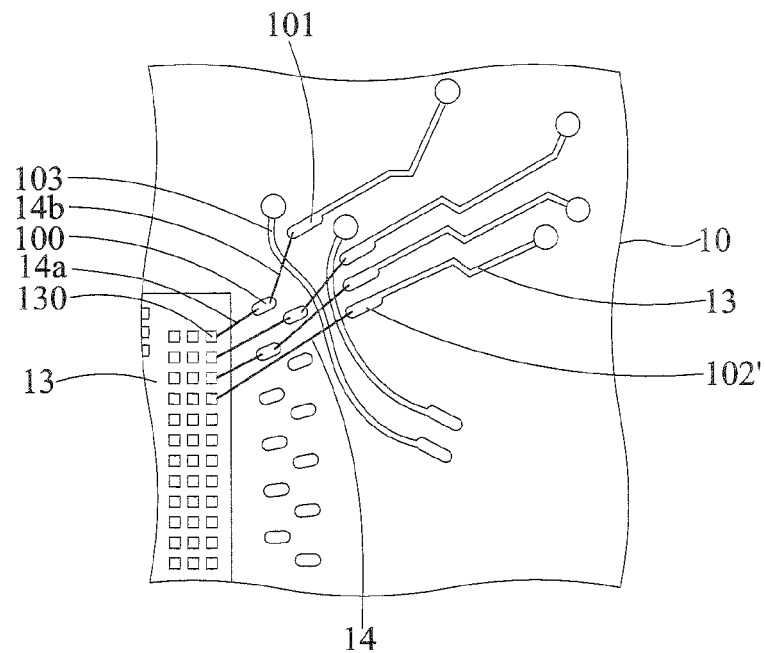
Figure 2A:
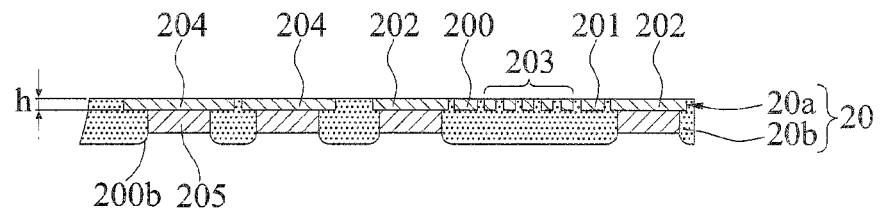
FIGS. 2A to 2C are schematic cross-sectional views showing a fabrication method of a semiconductor package according to the present invention.
Figure 2A:
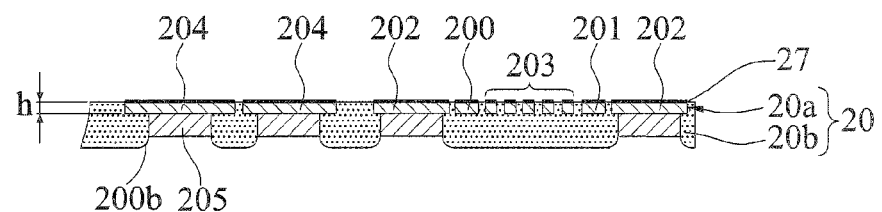
Figure 2B:
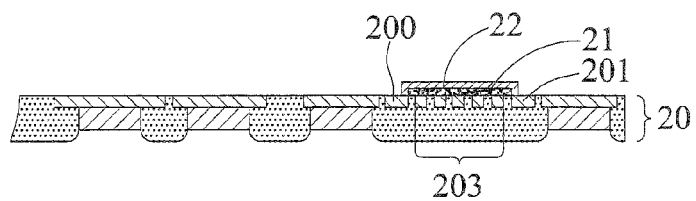
Figure 2C:
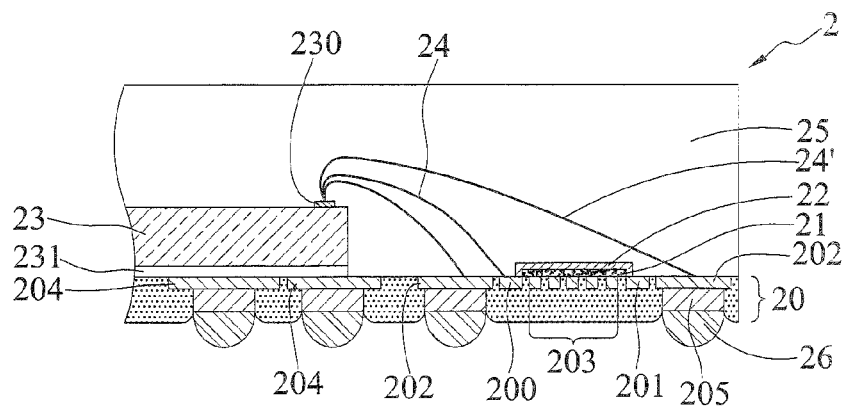
Figure 2C:
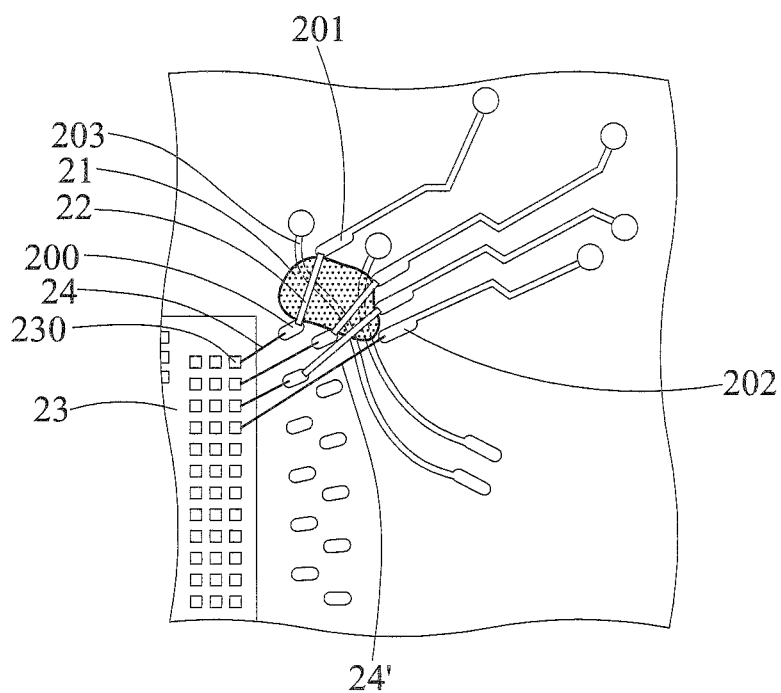

FIGS. 2A to 2C are schematic cross-sectional views showing a fabrication method of a semiconductor package 2 according to an embodiment of the present invention.

Referring to FIG. 2A, a substrate 20 having an insulating layer 20b and a circuit layer 20a embedded in the insulating layer 20a is provided. A plurality of switching pads 200, a plurality of first and second conductive pads 201, 202, at least a die attach pad 204 and a plurality of circuits 203 are formed on an upper side of the circuit layer 20a. The circuits 203 are formed between the switching pads 200 and the first conductive pads 201. Further, a plurality of ball pads 205 are formed on a lower side of the circuit layer 20a.

In the present embodiment, the substrate 20 has a single-layer circuit structure. The insulating layer 20b is an encapsulant. The circuits 203 protrude a height h above the insulating layer 20b. The height h is 5 to 15 um.

Surfaces of the switching pads 200, the first and second conductive pads 201, 202, the circuits 203 and the die attach pad 204 are exposed from an upper side of the insulating layer 20b, and the ball pads 205 are exposed from a lower side of the insulating layer 20b through such as a plurality of openings 200b of the insulating layer 20b.

The first and second conductive pads 201, 202, the circuits 203 and the die attach pad 204 are electrically connected to the ball pads 205.

Referring to FIG. 2A', in another embodiment, a surface processing layer 27 can be formed on the switching pads 200, the first and second conductive pads 201, 202, the circuits 203 and the die attach pad 204. The surface processing layer 27 can be a Ni—Au layer or an OSP (Organic Solderability Preservative) layer.

Referring to FIG. 2B, an insulating layer 21 is formed on the substrate 20 to cover the circuits 203 and a conductive layer 22 is further formed on the insulating layer 21. The conductive layer 22 extends to the switching pads 200 and the first conductive pads 201. As such, the switching pads 200, the conductive layer 22 and the first conductive pads 201 form conductive paths. The circuits 203 are electrically isolated from the conductive layer 22 by the insulating layer 21 so as to prevent a short circuit from occurring between the circuits 203 and the conductive layer 22.

In the present embodiment, the insulating layer 21 is made of an adhesive and formed by inkjet printing, coating or dispensing. The conductive layer 22 can be a metal layer formed by screen printing or inkjet printing or an adhesive layer formed by coating, dispensing or inkjet printing so as to form conductive traces.

Referring to FIGS. 2C and 2C', a semiconductor element 23 having a plurality of electrode pads 230 is disposed on the die attach pad 204 of the substrate 20 via an adhesive 231. The electrode pads 230 of the semiconductor element 23 are electrically connected to the switching pads 200 and the second conductive pads 202 through a plurality of bonding wires 24, 24', respectively. That is, a portion of the electrode pads 230 of the semiconductor element 23 are electrically connected to the switching pads 200 through the bonding wires 24 and further electrically connected to the ball pads 205 through the switching pads 200, the conductive layer 22 and the first conductive pads 201.

Then, an encapsulant 25 is formed on the substrate 20 for encapsulating the semiconductor element 23, the bonding wires 24, 24', the switching pads 200, the conductive layer 22 and the first and second conductive pads 201, 202. Thereafter, a plurality of conductive elements 26 such as solder balls are formed on the ball pads 205.

Therefore, the present invention electrically connects the switching pads 200 and the first conductive pads 201 through the conductive layer 22 instead of the conventional short bonding wires. Since the conductive layer 22 has a height much lower than the wire loop of the conventional short bonding wires, during a wire bonding process, the long bonding wires 24' will not come into contact with the conductive layer 22, thus preventing a short circuit form occurring. Further, the present invention can reduce the wire loop of the long bonding wires 24' and hence reduce the thickness of the encapsulant 25 so as to facilitate miniaturization of the semiconductor package 2.

Further, the formation of the insulating layer 21 and the conductive layer 22 increases the wiring space and the wiring flexibility. Therefore, the circuits 203 and the conductive layer 22 can be formed in multi-layers.

The present invention further provides a semiconductor package 2, which has: a substrate 20 having a plurality of switching pads 200, a plurality of first conductive pads 201 and a plurality of circuits 203 formed between the switching pads 200 and the first conductive pads 201; an insulating layer 21 formed on the substrate 20 to cover the circuits 203; a conductive layer 22 formed on the insulating layer 21 and extending to the switching pads 200 and the first conductive pads 201; a semiconductor element 23 disposed on the substrate 20 and electrically connected to the switching pads 200 through a plurality of bonding wires 24; and an encapsulant 25 formed on the substrate 20 for encapsulating the semiconductor element 23, the bonding wires 24, the switching pads 200, the conductive layer 22 and the first conductive pads 201.

In an embodiment, the substrate 20 further has an insulating layer 20b formed in a manner that the switching pads 200 and the first conductive pads 201 are embedded in the insulating layer 20b and surfaces of the switching pads 200 and the first conductive pads 201 are exposed from the insulating layer 20b.

In an embodiment, the circuits 203 protrude above a surface of the substrate 20 or the insulating layer 20b.

The insulating layer 21 can be made of an adhesive.

The conductive layer 22 can be an adhesive layer or a metal layer.

The switching pads 200, the conductive layer 22 and the first conductive pads 201 form conductive paths.

In an embodiment, the substrate 20 further has a plurality of second conductive pads and the semiconductor element 23 is electrically connected to the second conductive pads 202 through a plurality of bonding wires 24'.

In an embodiment, a surface processing layer 36 is formed on the switching pads 200, the circuits 203 and the first conductive pads 201.

Therefore, by electrically connecting the switching pads and the first conductive pads through the conductive layer, the present invention dispenses with the conventional short bonding wires so as to prevent the conventional problem of short circuits caused by contact of the short bonding wires with other bonding wires, increase the product reliability and facilitate miniaturization of the semiconductor package.

Further, the formation of the insulating layer and the conductive layer on the circuits of the substrate facilitates to increase the wiring space and the wiring flexibility.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor package, comprising:
    a substrate having a plurality of switching pads, a plurality of first conductive pads, a plurality of circuits formed between the switching pads and the first conductive pads; and a second insulating layer formed in a manner that the switching pads and the first conductive pads are embedded in the second insulating layer, and surfaces of the switching pads and the first conductive pads are exposed from the second insulating layer;
    a first insulating layer covering the circuits;
    a conductive layer formed on the first insulating layer and extending to the switching pads and the first conductive pads; and
    a semiconductor element disposed on the substrate and electrically connected to the switching pads through a plurality of bonding wires.

2. The package of claim 1, wherein the substrate further has a plurality of second conductive pads and the semiconductor element is electrically connected to the second conductive pads through a plurality of bonding wires.

3. The package of claim 1, wherein the circuits protrude above a surface of the Substrate.

4. The package of claim 1, wherein the switching pads, the conductive layer and the first conductive pads form conductive paths.

5. The package of claim 1, further comprising a surface processing layer formed on the switching pads, the circuits and the first conductive pads.

6. The package of claim 1, wherein the first insulating layer is made of an adhesive.

7. The package of claim 1, wherein the conductive layer is an adhesive layer of a metal layer.

8. The package of claim 1, further comprising an encapsulant formed on the substrate for encapsulating the semiconductor element, the bonding wires, the switching pads, the conductive layer and the first conductive pads.

9. A fabrication method of a semiconductor package, comprising the steps of:
    providing a substrate having a plurality of switching pads, a plurality of first conductive pads and a plurality of circuits formed between the switching pads and the first conductive pads;
    forming an insulating layer to cover the circuits;
    forming a conductive layer on the insulating layer, wherein the conductive layer extends to the switching pads and the first conductive pads; and
    disposing a semiconductor element on the substrate and electrically connecting the semiconductor element and the switching pads through a plurality of bonding wires, wherein the conductive layer is a metal layer formed by inkjet printing or screen printing or an adhesive layer formed by coating, dispensing or inkjet printing so ad to form conductive traces.

10. The method of claim 9, further comprising electrically connecting the semiconductor element and a plurality of second conductive pads of the substrate through a plurality of bonding wires.

11. The method of claim 9, wherein the circuits protrude above a surface of the substrate.

12. The method of claim 9, wherein the switching pads, the conductive layer and the first conductive pads form conductive paths.

13. The method of claim 9, wherein a surface processing layer is formed on the switching pads, the circuits and the first conductive pads.

14. The method of claim 9, wherein the insulating layer is made of an adhesive.

15. The method of claim 9, wherein the insulating layer is formed by inkjet printing, coating or dispensing.

16. The method of claim 9, further comprising forming an encapsulant on the substrate for encapsulating the semiconductor element, the bonding wires, the switching pads, the conductive layer and the first conductive pads.

* * * * *